(12) United States Patent
Poulter et al.

(10) Patent No.: US 6,399,890 B1
(45) Date of Patent: Jun. 4, 2002

(54) PRINTED CIRCUIT BOARD HAVING DUAL PURPOSE PROFILE

(75) Inventors: Alan R Poulter, Bedford; Richard N Bayfield, Milton Keynes; Bryan J Donoghue, St Albans; Mark A Bobbitt, Hemel Hempstead; David J Law, Edinburgh; Edward Turner, Maidenhead, all of (GB)

(73) Assignee: 3Com Corporation, Santa Clara, CA (US)

( * ) Notice: Subject to any disclaimer, the term of this patent is extended or adjusted under 35 U.S.C. 154(b) by 0 days.

(21) Appl. No.: 09/953,275

(22) Filed: Sep. 17, 2001

(30) Foreign Application Priority Data

Apr. 20, 2001 (GB) .............................. 0109739

(51) Int. Cl.[7] .................................. H05K 1/16
(52) U.S. Cl. ..................... 174/255; 174/201; 361/752
(58) Field of Search ................. 174/255, 261; 361/752, 803; 439/67, 235

(56) References Cited

U.S. PATENT DOCUMENTS

| | | | |
|---|---|---|---|
| 4,241,381 A | 12/1980 | Cobaugh et al. | |
| 5,316,489 A | * 5/1994 | Kachlic et al. | 439/79 |
| 5,387,132 A | 2/1995 | Sarver et al. | |
| 5,470,240 A | 11/1995 | Suzuki | |
| 5,699,213 A | * 12/1997 | ElHatem et al. | 174/261 |
| 5,777,855 A | * 7/1998 | Yokajity | 361/803 |
| 6,016,089 A | * 1/2000 | Goudie | 333/183 |
| 6,246,016 B1 | * 6/2001 | Roessler et al. | 174/261 |
| 6,341,988 B1 | * 1/2002 | Zhu et al. | 439/630 |

FOREIGN PATENT DOCUMENTS

| | | |
|---|---|---|
| EP | 0379176 A2 | 7/1990 |
| EP | 0425192 A2 | 5/1991 |
| EP | 0493801 A2 | 7/1992 |

* cited by examiner

Primary Examiner—Albert W. Paladini
(74) Attorney, Agent, or Firm—Nixon & Vanderhye P.C.

(57) ABSTRACT

A printed circuit board which has in a first edge a first notch and a second notch a first predetermined distance apart and along said first edge between said first and second notches a plurality of terminal pads in a broadside array, the first edge including a third notch spaced from the second notch and disposed a second predetermined distance, greater than the first predetermined distance, from said first notch, the board having along and adjacent the first edge between the second and third notches a second plurality of terminal pads arranged in a respective broadside array.

3 Claims, 1 Drawing Sheet

PRINTED CIRCUIT BOARD HAVING DUAL PURPOSE PROFILE

FIELD OF THE INVENTION

This invention relates to printed circuit boards and particularly relates to a printed circuit board which is designed for cooperation with a flanged connector having a predetermined multiplicity of terminals and is adapted for use with at least one other connector having a greater multiplicity of terminals.

SUMMARY OF THE INVENTION

According to the invention a printed circuit board in generally rectangular form has a first edge, a second edge generally parallel to the first edge and third and fourth edges each extending generally at right angles to said first and second edges and has in said first edge a first notch and a second notch a first predetermined distance apart and along said first edge between said first and second notches a plurality of terminal pads in a broadside array, said first edge including a third notch spaced from the second notch and disposed a second predetermined distance, greater than the first predetermined distance, from said first notch, the board having along and adjacent said first edge between the second and third notches a second plurality of terminal pads arranged in a respective broadside array.

In a preferred form of the invention, the aforementioned contacts are disposed on each of the two broad faces of the printed circuit board between the first and second notches and between the second and third notches.

A specific embodiment of the invention is intended for use with an existing 68-way connector, which is arranged to make contact with two sets of 34 terminal contacts each arranged along one edge of the printed circuit board and on opposite faces of the board, the connector having a peripheral flange which can engage the first and second notches and be located thereby so that the terminal pins or contacts are properly indexed to the contacts along the first side edge of the printed circuit board. The particular printed circuit board profile in the preferred embodiment of the invention enables the same printed circuit board to be suitable for use with a connector having a larger number of pins and with a flange that engages the first and third notches.

DESCRIPTION OF THE PREFERRED EMBODIMENT

Figure 1:
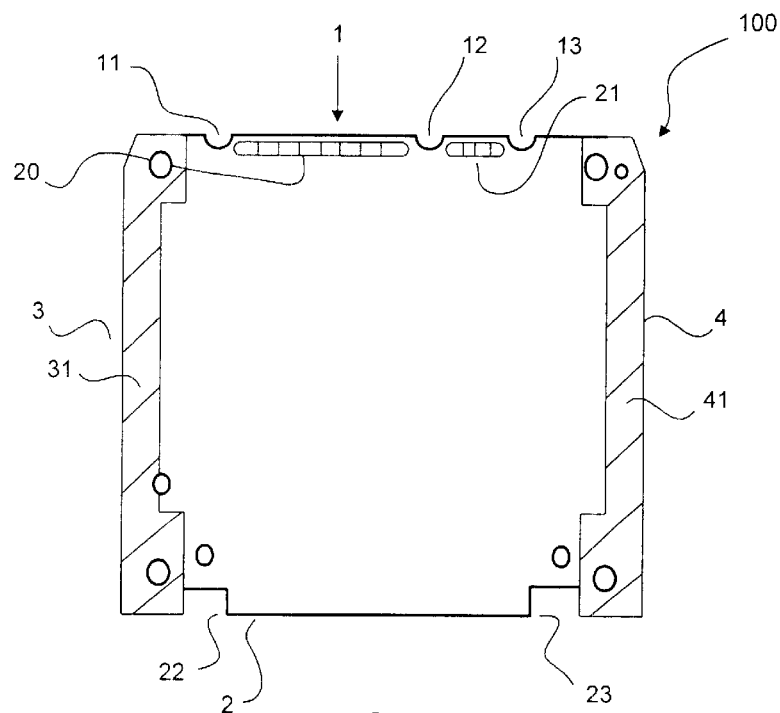
FIG. 1 of the drawings is a plan view of a printed circuit board according to the invention.
Figure 2:
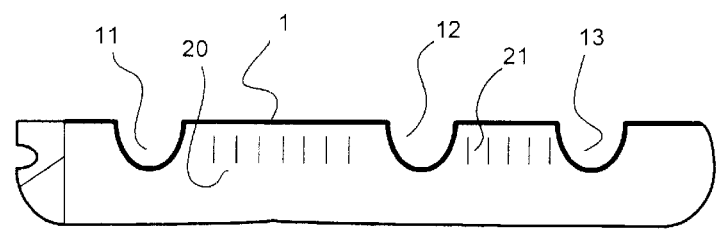
FIG. 2 is an enlarged plan view of part of one edge of the printed circuit board.
Figure 3:
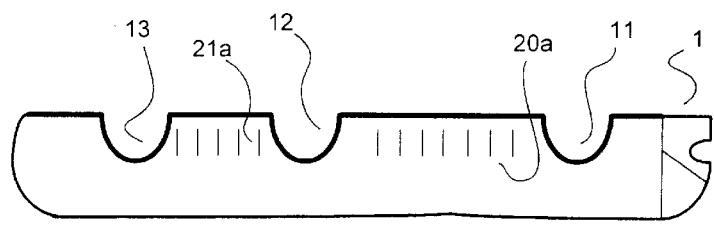
FIG. 3 is an enlarged plan view of part of the underside of the printed circuit board.

The drawings illustrate a printed circuit board 100 which is in generally rectangular form having four edges 1, 2, 3 and 4 constituting a generally rectangular profile, a first edge 1 being generally parallel to second edge 2, and a third edge 3 being generally parallel to a fourth edge 4. The board carries a broadside array 20 of terminal pads which are arranged close to the edge 1 and adjacent each other so that they can be simultaneously contacted by a terminal connector, particularly type 7771-068-002, which is a flanged connector capable of engaging simultaneously two arrays, each of thirty-four terminal pads, one on each face of the board. In order to provide proper location of such a standard connector with the array 20 of terminal pads, the first edge 1 has a first notch 11 and a second notch 12 positioned a predetermined distance apart. Each of these notches may be, for example, 35 mm wide and 5 mm deep. The notches 11 and 12 accommodate the peripheral flange of the connector and index it properly so that the terminal contacts in the connector may contact all the terminal pads 20 on the printed circuit board and also those similarly arranged pads 20a between the notches 11 and 12 on the other face of the connector as shown in FIG. 3.

In order to enable the same printed circuit board to be used with a different connector, and particularly a connector having a greater multiplicity of terminal pins, the edge 1 has a further notch 13 spaced from notch 12 and further away from notch 11 than is notch 12. A second broadside array of pads 21 is located adjacent edge 1 between notches 12 and 13. A corresponding array of pads 21a is disposed on the underside between notches 12 and 13 as shown in FIG. 3. The notches 11 and 13 act as location notches for a connector which typically has 104 contacts, but in any event have a greater number of contacts than the connector which normally engages in notches 11 and 12. Contacts on the larger connector which are so located as to enter notch 12 do not engage any pads. However, with appropriate design of the printed circuit board the loss of a few terminal connections for the "100 pin" connector is a consequence of less importance than the ability of the printed circuit board to be used with a multiplicity of connectors.

The edge 2 may be formed with a pair of shoulders 22 and 23 which can provide location for a connector engaging pads disposed along the edge 2 in a broadside array.

The components on the printed circuit board can of course be arranged in any desired manner depending on the nature and purpose of the circuit which is to be carried on the printed circuit board. The shaded areas 31 and 41 immediately adjacent edges 3 and 4 may be forbidden areas in order to enable the edges 3 and 4 to be accommodated in slider rails or the like. Very typically there is a limitation of a maximum height of components with respect to the plane of the printed circuit board.

The printed circuit board may have placement holes which serve for machining and also further holes which may be provided to receive copper fingers.

In a specific embodiment, the distance between edges 3 and 4 is 105.2 mm with a tolerance of 0.2 mm. The depth of the printed circuit board between edges 1 and 2 may be 96.5 mm with a tolerance of 0.2 mm.

What is claimed is:

1. A printed circuit board in generally rectangular form having a first edge, a second edge generally parallel to the first edge and third and fourth edges each extending generally at right angles to said first and second edges, the board having in said first edge a first notch and a second notch a first predetermined distance apart and along said first edge between said first and second notches a plurality of terminal pads in a broadside array, said first edge including a third notch spaced from the second notch and disposed a second predetermined distance, greater than the first predetermined distance, from said first notch, the board having along and adjacent said first edge between the second and third notches a second plurality of terminal pads arranged in a respective broadside array.

2. A board according to claim 1 wherein terminal pads are disposed on each of the two broad faces of the printed circuit board between the first and second notches and between the second and third notches.

3. A printed circuit board in generally rectangular form having two broad faces and having:

a first edge, a second edge generally parallel to the first edge and spaced substantially 96.5 mm therefrom;

third and fourth edges spaced substantially 105.2 mm from each other and each extending generally at right angles to said first and second edges;

a first notch and a second notch formed in said first edge a first predetermined distance apart;

a plurality of terminal pads in a broadside array along said first edge on at least one of said broad faces between said first and second notches;

a third notch formed in said first edge, being spaced from the second notch and disposed a second predetermined distance, greater than the first predetermined distance, from said first notch; and along and adjacent said first edge between the second and third notches a second plurality of terminal pads arranged in a respective broadside array.

* * * * *